United States Patent [19]

Liebermann

[11] Patent Number: 4,719,428

[45] Date of Patent: Jan. 12, 1988

[54] STORAGE BATTERY CONDITION TESTER UTILIZING LOW LOAD CURRENT

[75] Inventor: Leonard Liebermann, La Jolla, Calif.

[73] Assignee: TIF Instruments, Inc., Miami, Fla.

[21] Appl. No.: 741,126

[22] Filed: Jun. 4, 1985

[51] Int. Cl.[4] ............................................. G01N 27/46
[52] U.S. Cl. ..................................... 324/436; 324/427
[58] Field of Search ............... 324/426, 427, 429, 433, 324/436; 340/636; 320/48

[56] References Cited

U.S. PATENT DOCUMENTS

| | | | |
|---|---|---|---|
| 3,753,094 | 8/1973 | Furuishi et al. ....................... | 340/636 |
| 3,873,911 | 3/1975 | Champlin ............................ | 340/636 |
| 3,909,708 | 9/1975 | Champlin ............................ | 324/430 |
| 4,590,430 | 5/1986 | Vandenbeaghe et al. ........... | 324/427 |

FOREIGN PATENT DOCUMENTS 8200706  9/1983  Netherlands ....................... 324/436

OTHER PUBLICATIONS

Willihnganz et al, "Battery Impedance", vol. 78, Electrical Engineering, 9/1959. pp. 922–925.

*Primary Examiner*—Reinhard J. Eisenzopf
*Assistant Examiner*—Walter E. Snow
*Attorney, Agent, or Firm*—Brown, Martin, Haller & Meador

[57] ABSTRACT

A condition tester for a storage battery that monitors the effect of internal battery resistance without drawing large currents. A switched load periodically draws a small current across the battery terminals. An AC voltage is produced at the battery terminals resulting from the oscillating current and the internal battery resistance. That small oscillating voltage is amplified, rectified and filtered to produce a DC voltage which depends upon the AC component. This DC voltage is subtracted from the nominal battery voltage and the difference is indicated by an appropriate meter. As the battery deteriorates its internal resistance increases causing the meter reading to decrease, thereby reflecting battery condition.

15 Claims, 5 Drawing Figures

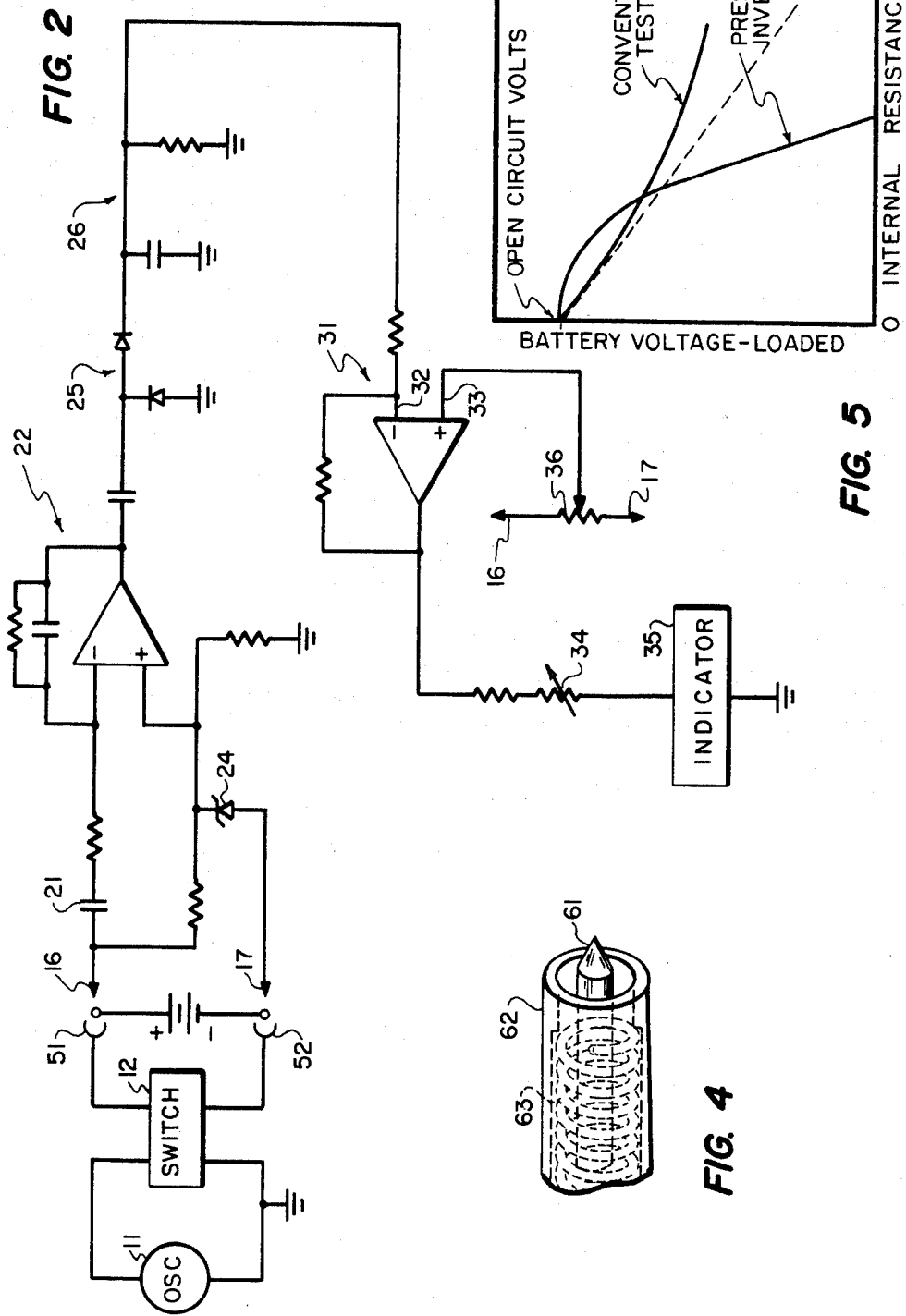

STORAGE BATTERY CONDITION TESTER UTILIZING LOW LOAD CURRENT

FIELD OF THE INVENTION

This invention relates generally to battery testers and more particularly to a device which draws very little power from the battery and simulates a high power drain to provide an indication of battery condition.

DISCUSSION OF THE PRIOR ART

Electrical instruments of various types for testing storage batteries have been available for some time. Substantially all of these prior devices function by drawing large currents, typically more than 150 amperes, from the battery and observing the decrease in battery output voltage compared with the open circuit (0 current) voltage. The value of the voltage decrease is a measure of battery condition.

Technically, these prior art storage battery testers monitor the internal resistance of the battery. As a battery deteriorates the internal resistance increases, leading to greater voltage drop when drawing current. Such testing instruments have significant drawbacks. When one of these devices is used, a weak battery is further weakened by testing because large currents are drawn. Additionally, these testing instruments require heavy, high current leads and special resistors which can tolerate heating because of the large currents drawn.

It is well known that the internal resistance of a battery can be measured by an AC bridge without using heavy currents. At least one such device specifically measures the battery's inverse dynamic resistance as an accurate and sensitive indicator of the condition of the battery.

SUMMARY OF THE INVENTION

Broadly speaking, this invention provides a storage battery tester which monitors the effect of internal battery resistance but without drawing large currents. The system effectively simulates a heavy current drain on a battery and therefore the effect of internal resistance on the output voltage. It functions without drawing a large current, and hence does not require heavy leads nor high heat dissipating resistors.

The instrument of this invention indicates battery voltage as if it were under a heavy load but without actually applying that load. An oscillator controls a switching circuit connected to the battery terminal. When the oscillator reaches a certain point in its cycle, the switch turns on and the battery conducts through a known resistance value. The periodic current through the switch circuit is typically 2-4 amperes at approximately 100 Hz. The remainder of the circuit measures the amplitude of the voltage across the battery terminals pursuant to the switching action of the oscillator. The voltage amplitude of the periodic signal reflects the effect of the internal resistance in the battery, and increased internal resistance results in increased voltage measured by the circuit. Thus the magnitude of the very small oscillating voltage is the parameter measured by which this invention monitors the condition of the battery.

The AC component of the signal detected by the circuit is amplified, rectified and filtered to produce a DC voltage. This DC voltage is then subtracted from battery voltage at a nominal 12 volts, by means of an operational amplifier. The difference is indicated on an appropriate display, such as an analog or digital meter.

The circuit is specifically designed so that the DC voltage is not directly proportional to the AC component. The rectifier circuit effectively ignores AC signals whose amplitudes are less than a predetermined level. Hence, any observed decrease in the meter reading will thus emphasize deterioration of the condition of the battery. For example, the DC voltage detected by the circuit is calibrated to be negligible in a new battery and the meter shows typically 12.6 volts, approximately the open circuit voltage. However, as the battery deteriorates and its internal resistance increases, the meter reading will decrease somewhat more rapidly than with conventional battery testers, thereby providing quick and positive indication of reduced battery condition.

BRIEF DESCRIPTION OF THE DRAWING

The objects, advantages and features of this invention will be more readily appreciated from the following detailed description when read in conjunction with the accompanying drawing, in which:

FIG. 2 is a schematic diagram of the detector circuit shown in FIG. 1;

FIG. 4 is a partial representation, in perspective, of the dual element probe used by the tester to make contact with the battery terminals; and FIG. 5 is a graph which compares the effect of increasing internal resistance on the battery voltage under load both with this tester and with a prior art tester.

DESCRIPTION OF THE PREFERRED EMBODIMENTS

Figure 1:
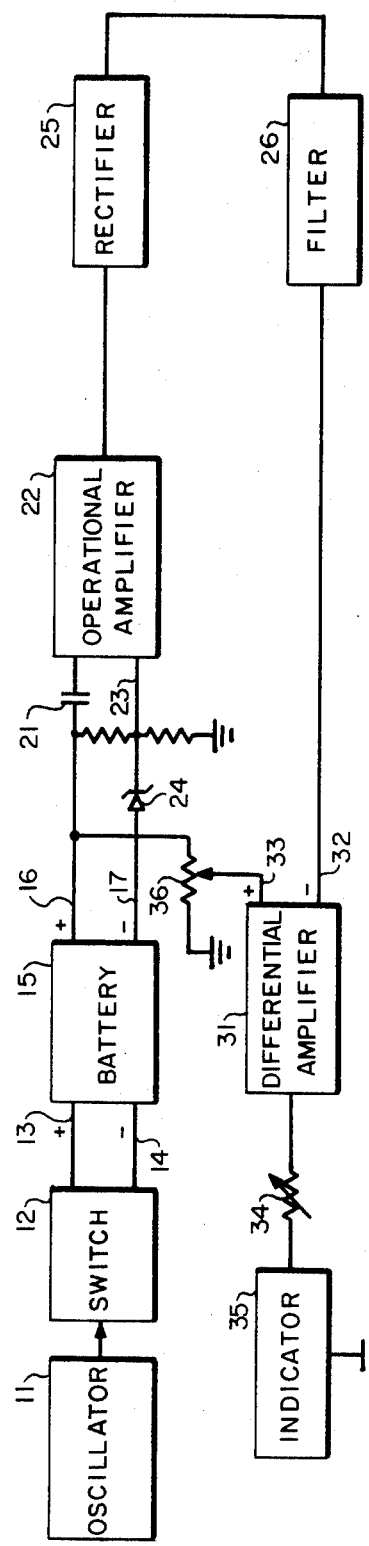
FIG. 1 is a block diagram of the battery condition tester of this invention.

With reference now to the drawing, and more particularly to FIG. 1 thereof, there is shown oscillator 11 controlling switch 12 which is coupled to the plus and minus terminals of battery 15 at respective locations 13 and 14. The detection portion of the circuit is connected to the battery plus and minus terminals at respective locations 16 and 17. Capacitor 21 separates the AC component of the battery current which signal is then amplified by operational amplifier 22 in a conventional manner. Zener diode 24 is connected between the negative battery terminal and terminal 23 of amplifier 22 and functions in a known manner. The signal from the amplifier is converted to direct current by rectifier 25 and this signal is smoothed by filter 26. The DC signal is then connected to differential amplifier 31 at negative terminal 32 and a portion the nominal battery voltage is applied to terminal 33 of the differential amplifier. Variable resistors 34 and 36 are employed to calibrate indicator 35 so that it clearly provides an indication when the battery is going bad. By adjusting both resistors, the indicator can be calibrated to provide an output signal to simulate battery voltage with heavy currents and can also be calibrated to display nominal battery voltage (12 volts) before the oscillator switching circuit is applied to the battery. Indicator 35 may be any type of device, such as an analog or a digital meter.

With respect to rectifier 25, note that this conventional diode arrangement (FIG. 2) becomes an inefficient rectifier at small signal amplitudes. For the typical silicon rectifiers, rectification is poor when the applied signal amplitude is less than 0.6 volts. This has the advantage of attenuating AC signals in the detecting circuit with amplitudes less than 0.6 volts, as may be designed to be encountered in a good battery. Thus the output of amplifier 22, for a good battery, could be set at 0.4 volts. As the battery condition deteriorates, the output of the amplifier increases above 0.6 volts and the rectifier functions efficiently to provide the desired signal.

Figure 3:
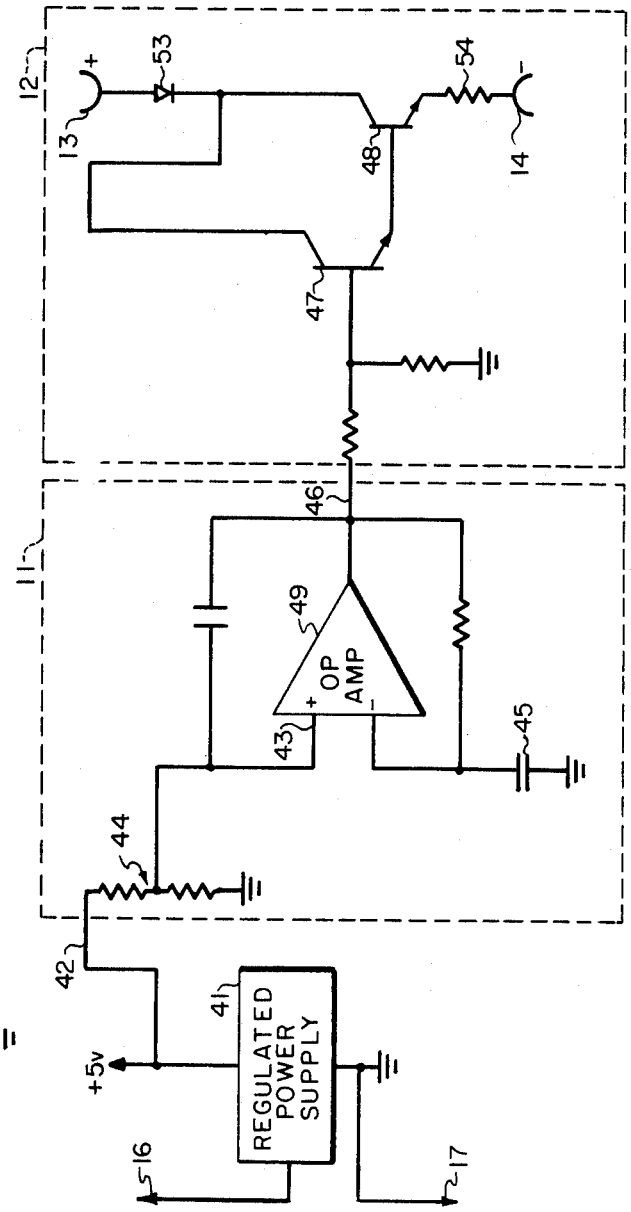
FIG. 3 is the oscillator and switch portion of the circuit shown in FIG. 1.

With reference now to FIG. 3, regulated power supply 41 provides a constant five volts where needed in the circuit. Oscillator 11 functions in a conventional manner as is apparent from observation. The signal to the positive input terminal 43 of operational amplifier 49 is supplied through voltage divider 44 and the negative terminal of the amplifier is grounded through capacitor 45. The output of the oscillator on conductor 46 is typically a square wave which functions to trigger switch 12, which is a conventional Darlington configuration of transistors 47 and 48. Switch terminals 13 and 14, when connected to the respective plus and minus battery terminal locations, provide a conductive path through conductive high current diode 53, transistor 48 and resistor 54 which latter element determines the battery current. As stated previously, that current may range between 2 and 4 amperes when switch 12 is turned on.

The schematic diagram of FIG. 2 shows the circuit of FIG. 1 in somewhat greater detail. The function of the elements of this circuit should be self evident and need little further explanation. It should be noted that variable resistor 36 can be adjusted so that a battery in poor condition will read close to zero under simulated high current.

The dual probe is shown in an enlarged representation in FIG. 4 and only the forward portion of the probe is shown. Center pointed element 61 is spring-loaded by means of coil spring 63 within outer cylindrical conductive sleeve 62. For initial calibration, the pointed probe 61 is placed in contact with the battery terminals at locations 16 and 17 and the nominal (open circuit) battery voltage is detected and the indicator calibrated by means of the variable resistors. When it is desired to run a test on the battery for its condition, the sleeve 62 is pressed downwardly to make separate contact with the battery terminals at locations 13 and 14. The sleeve functions as contacts 51 and 52 and provides the switched current across the battery terminals. With the oscillator functioning, the load is switched across the battery as previously described and the circuit of FIG. 2 detects the relatively small voltage across terminals 16 and 17, normally 10-50 millivolts. This AC signal is then amplified, rectified and filtered as previously described, to produce a signal of approximately 0 to 2 volts on terminal 32 of differential amplifier 31, which is subtracted therein from a portion of nominal battery voltage applied at terminal 33. The difference of approximately 0 to 2 volts is supplied through variable resistor 34 to indicator 35. The indicator is calibrated to read full scale, for example, 15 volts, with an input of approximately 2 volts.

With respect to the oscillator, the regulated five volts applied thereto is constant so that the oscillator amplitude does not vary and thereby the switching current is held constant, regardless of the condition of the contacts with the battery terminals. In order to further avoid the effects of contact resistance at the terminals which are frequently corroded, the dual contacts are used as explained above. It is possible that the signal could be erroneous if the dual contacts of FIG. 4 were not used. For example, if one were to both effect the switching and detect the resultant voltage by means of a common contact applied to each of the battery terminals, it would be necessary to account for contact corrosion in the detecting circuit. However, the separate contacts of the detecting circuit are not drawing any significant current so corrosion is not a factor. For example, assume a detection circuit current, such as 0.01 amperes, the amount of error caused by corrosion would be so low as to be insignificant.

As noted above, by means of the system of this invention the output voltage of the battery will be observed to diminish as its internal resistance increases, just as in a conventional tester. The experienced operator is familiar with this kind of performance and therefore would not need to be reeducated to use the present invention. What may not be apparent to the operator is that this invention differs from a conventional tester in two fundamental respects. First, the observed decrease in battery voltage under load is only an apparent decrease; the actual decrease is negligibly small, of the order of 10 to 50 millivolts. Amplification makes the decrease appear much larger.

Secondly, the simulated decrease of battery voltage is deliberately emphasized compared to a conventional tester. Referring to FIG. 5 which compares the voltage decrease for a conventional tester and this invention, it is seen that the prior art tester shows a smaller voltage decrease than if it were linearly proportional to internal resistance. This is because the load current is not constant but diminishes as the battery voltage decreases.

In the present invention the observed voltage remains essentially unchanged from open circuit when the internal resistance is in the normal range of a "good" battery. This reflects the discussion above with respect to rectifier 25. In the "good" battery range small signals are applied to the rectifier. Because of the characteristics of the rectifier, these small signals, which result from small increases in internal resistance, provide little or no perceivable reading on indicator 35. However, whenever the resistance increases beyond a critical value, that is, beyond the "good" range for the battery the simulated output voltage drops far more rapidly than in the conventional tester and can reach zero output. Hence the operator is dramatically made aware of a battery which is approaching or has reached the need for replacement.

The present invention has another practical advantage in testing batteries. Usually heavy clamps connect to the posts of an installed battery, leaving only the circular top of the posts accessible. Typically prior art battery testers are fitted with heavy alligator clips. Because the posts of an installed battery are not accessible for connection by alligator clips, the tester often must determine battery voltage through the corrosion frequently existing between the post and its clamp. Such corrosion can indicate a large resistance and the tester can show that the battery needs to be replaced. That determination could be totally erroneous.

This invention permits direct access, even to the posts of installed batteries. Pointed element 61 can make contact at any point on the top of a battery post, connecting the detecting circuitry to the battery. Connection of the switching circuit is accomplished by depressing sleeve 62 until it contacts the post.

It should now be apparent that the operator can quickly get a rough idea of the amount of drain on the battery that is due to terminal corrosion. A first reading can be made with the dual probe directly in contact with the battery posts. A second reading can be taken with the dual probe in contact with the clamp connecting the battery to the electrical system of the vehicle. It is possible that a battery which is actually good will lose so much due to corroded contacts at its terminals that the second reading would indicate that the battery should be replaced.

In view of the above description, it is likely that modifications and improvements will occur to those skilled in the art which are within the scope of the appended claims.

What is claimed is:

1. A battery condition tester for a battery having positive and negative terminals, said battery condition tester comprising:
   means comprising a switching circuit for periodically switching on and off a low constant current load between said battery terminals through a first set of battery terminal contacts; and
   means comprising a separate detection circuit including:
   first amplifier means coupled to said positive and negative terminals through a second set of battery terminal contacts to amplify the AC component of the battery voltage resulting from the switched battery current;
   means for providing a DC voltage derived from the AC component of switched battery voltage;
   means for providing an output signal related to battery condition as determined by said DC voltage; and
   indicator means adapted to provide a reading indicative of the value of the battery voltage under heavy load.

2. The battery condition tester recited in claim 1, and further comprising:
   means for subtracting said DC voltage from a portion of nominal battery voltage;
   said indicator means providing indication of the difference voltage from said subtracting means;
   whereby battery voltage under heavy load is related to the difference voltage.

3. The battery condition tester recited in claim 1 wherein said switching means comprises:
   an oscillator adapted to be connected to a source of electrical power;
   a switching circuit coupled to said oscillator;
   means for connecting the output of said switching circuit to said positive and negative terminals of said battery;
   a load resistor in said switching circuit connected across said positive and negative terminals of said battery;
   whereby said switching circuit provides a conductive path of constant current through said resistor between said battery terminals during a portion of each cycle of said oscillator operation.

4. The battery condition tester recited in claim 2, wherein said switching means comprises:
   an oscillator adapted to be connected to a source of electrical power;
   a switching circuit coupled to said oscillator;
   means for connecting the output of said switching circuit to said positive and negative terminals of said battery;
   a load resistor in said switching circuit connected across said positive and negative terminals of said battery;
   whereby said switching circuit provides conductive path through said resistor between said battery terminals during a portion of each cycle of said oscillator operation.

5. The battery condition tester recited in claim 1, and further comprising:
   means for non-linearly rectifying the output signal of said first amplifier means;
   filter means for smoothing the output of said non-linear rectifying means to produce a DC voltage.

6. The battery condition tester recited in claim 5, and further comprising:
   second amplifier means having as one input the DC voltage from said filter means;
   means coupled to said positive and negative terminals of said battery for applying a portion of the nominal battery voltage to a second input of said second amplifier means, said second amplifier means functioning to subtract said filtered DC voltage from the nominal battery voltage portion;
   said indicator means providing a reading indicative of the difference voltage from said second amplifier means;
   whereby battery voltage under heavy load is related to said difference voltage.

7. The battery condition tester recited in claim 1, said contacts comprising probe means to couple said tester to the battery, said probe having a central element spring loaded in a cylindrical element, whereby said amplifier and indicator means may be connected to said battery terminals by means of said central probe, and then said switching means connected to said battery terminals by means of said cylindrical element.

8. The battery condition tester recited in claim 5, wherein said rectifying means attenuates the output signal amplitudes below a pedetermined value in forming the DC voltage.

9. The battery condition tester recited in claim 6, wherein said rectifying means attenuates the output signal amplitudes below a predetermined value in forming the DC voltage.

10. A method for testing battery condition, said method comprising the steps of:
    periodically switching a constant current load from a switching circuit on and off across the positive and negative terminals of the battery to switch battery current on and off;
    isolating the switching circuit from a detection circuit by using two sets of battery contacts;
    detecting the AC component of battery voltage resulting from the switched battery current;
    producing a DC voltage from the AC component of switched battery voltage, said DC voltage being representative of the condition of the battery; and
    providing a reading indicative of the value of the battery voltage under heavy load by using said DC voltage.

11. The method recited in claim 10, and comprising the further steps of:
    amplifying said AC voltage;
    rectifying said amplified voltage; and
    smoothing said rectified voltage to thereby produce said DC voltage.

12. The method recited in claim 10, and comprising the further steps of:

subtracting said DC voltage from nominal battery voltage; and providing a reading indicative of the difference voltage, the battery voltage under heavy load being related to said difference voltage.

13. The method recited in claim 10, and comprising the further step of attenuating said AC voltage component below a predetermined value.

14. The method recited in claim 11, and comprising the further step of attenuating said AC voltage component below a predetermined value.

15. The method recited in claim 12, and comprising the further step of attenuating said AC voltage component below a predetermined value.

* * * * *